US012594746B2

(12) United States Patent
Choi et al.

(10) Patent No.:  US 12,594,746 B2
(45) Date of Patent:       Apr. 7, 2026

(54) COVER WINDOW FOR DISPLAY DEVICE AND DISPLAY DEVICE INCLUDING THE SAME

(71) Applicant: SAMSUNG DISPLAY CO., LTD., Yongin-si (KR)

(72) Inventors: Min-Hoon Choi, Seoul (KR); Heon Jung Shin, Hwaseong-si (KR); Hye-Jin Oh, Asan-si (KR); Jeoung Sub Lee, Seoul (KR); Kyung Tae Kim, Asan-si (KR); Bo A Kim, Icheon-si (KR); Sang Hoon Kim, Hwaseong-si (KR); Sang-Il Park, Yongin-si (KR); Hyun Joon Oh, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 169 days.

(21) Appl. No.: 17/346,163

(22) Filed: Jun. 11, 2021

(65) Prior Publication Data

US 2021/0300010 A1     Sep. 30, 2021

Related U.S. Application Data

(63) Continuation of application No. 16/852,344, filed on Apr. 17, 2020, now Pat. No. 11,058,021, which is a (Continued)

(30) Foreign Application Priority Data

Nov. 10, 2016    (KR) ........................ 10-2016-0149513

(51) Int. Cl.
*H05K 5/03* (2006.01)
*B32B 7/12* (2006.01)
(Continued)

(52) U.S. Cl.
CPC ................ *B32B 27/06* (2013.01); *B32B 7/12* (2013.01); *B32B 27/08* (2013.01); *B32B 27/34* (2013.01);
(Continued)

(58) Field of Classification Search
None
See application file for complete search history.

(56) References Cited

U.S. PATENT DOCUMENTS 5,609,954 A     3/1997  Aizawa et al.
5,925,456 A     7/1999  Malek
(Continued)

FOREIGN PATENT DOCUMENTS

KR          10-0383092 B1      5/2003
KR     10-2014-0013785 A       2/2014
(Continued)

OTHER PUBLICATIONS

Korean Office Action for KR Application No. 10-2016-0149513, dated Feb. 22, 2024, 11 pages.

*Primary Examiner* — Anthony J Frost
(74) *Attorney, Agent, or Firm* — Womble Bond Dickinson (US) LLP

(57) ABSTRACT

A cover window for a display device includes: a first film; a second film on the first film; and an adhesive layer between the first film and the second film. The adhesive layer has a lap shear modulus in a range of 20 kPa to 50 kPa.

11 Claims, 5 Drawing Sheets

Related U.S. Application Data continuation of application No. 15/791,935, filed on Oct. 24, 2017, now Pat. No. 10,667,417.

(51) Int. Cl.

| | |
|---|---|
| *B32B 27/06* | (2006.01) |
| *B32B 27/08* | (2006.01) |
| *B32B 27/34* | (2006.01) |
| *B32B 37/12* | (2006.01) |
| *G02F 1/1333* | (2006.01) |
| *G06F 1/16* | (2006.01) |
| *H10K 59/80* | (2023.01) |
| *H10K 77/10* | (2023.01) |
| *H10K 102/00* | (2023.01) |

(52) U.S. Cl.

CPC ........ *B32B 37/12* (2013.01); *G02F 1/133308* (2013.01); *G06F 1/1652* (2013.01); *H05K 5/03* (2013.01); *H10K 59/87* (2023.02); *H10K 77/111* (2023.02); *B32B 2307/42* (2013.01); *B32B 2307/51* (2013.01); *B32B 2307/536* (2013.01); *B32B 2377/00* (2013.01); *B32B 2457/20* (2013.01); *B32B 2457/206* (2013.01); *G02F 1/133331* (2021.01); *G02F 2202/28* (2013.01); *H10K 2102/311* (2023.02); *Y02E 10/549* (2013.01)

(56) References Cited

U.S. PATENT DOCUMENTS

| | | | |
|---|---|---|---|
| 9,720,299 | B1 | 8/2017 | Timmerman et al. |
| 10,669,450 | B2 | 6/2020 | Moon et al. |
| 2005/0079304 | A1 | 4/2005 | Clovesko et al. |
| 2011/0182443 | A1 | 7/2011 | Gant |
| 2013/0224425 | A1 | 8/2013 | Yamazaki |
| 2014/0030496 | A1 | 1/2014 | Oh et al. |
| 2014/0044962 | A1 | 2/2014 | Noguchi et al. |
| 2014/0118902 | A1 | 5/2014 | Kim |
| 2014/0160406 | A1* | 6/2014 | Huh ..................... G02B 5/3033 359/483.01 |
| 2014/0186604 | A1* | 7/2014 | Kim ........................... C09J 7/38 428/354 |
| 2015/0010742 | A1 | 1/2015 | Han et al. |
| 2015/0247070 | A1 | 9/2015 | Nam et al. |
| 2016/0002501 | A1 | 1/2016 | Niiyama et al. |
| 2016/0101593 | A1* | 4/2016 | Nam ....................... B32B 7/022 428/212 |
| 2016/0252769 | A1* | 9/2016 | Niiyama ........... G02F 1/133308 428/192 |
| 2017/0240774 | A1 | 8/2017 | Devanne et al. |
| 2017/0313039 | A1 | 11/2017 | Okawara et al. |
| 2017/0335144 | A1 | 11/2017 | Mitsui et al. |
| 2018/0061893 | A1 | 3/2018 | Breedlove et al. |
| 2018/0065881 | A1 | 3/2018 | Hashimoto et al. |
| 2018/0282445 | A1 | 10/2018 | Shibuya et al. |
| 2018/0354229 | A1 | 12/2018 | Onishi et al. |
| 2019/0187510 | A1 | 6/2019 | Hori et al. |
| 2019/0225845 | A1 | 7/2019 | Lee et al. |

FOREIGN PATENT DOCUMENTS

| | | |
|---|---|---|
| KR | 10-2014-0021966 A | 2/2014 |
| KR | 10-2014-0052732 A | 5/2014 |
| KR | 10-2015-0004496 A | 1/2015 |
| KR | 10-2016-0042360 A | 4/2016 |
| KR | 10-2016-0053788 A | 5/2016 |

* cited by examiner

COVER WINDOW FOR DISPLAY DEVICE AND DISPLAY DEVICE INCLUDING THE SAME

CROSS-REFERENCE TO RELATED APPLICATIONS

This application is a continuation of U.S. patent application Ser. No. 16/852,344, filed Apr. 17, 2020, which is a continuation of U.S. patent application Ser. No. 15/791,935, filed Oct. 24, 2017, now U.S. Pat. No. 10,667,417, which claims priority to and the benefit of Korean Patent Application No. 10-2016-0149513, filed Nov. 10, 2016, the entire content of each of which is incorporated herein by reference.

BACKGROUND

1. Field

Aspects of embodiments of the present disclosure relate to a cover window for a display device and a display device including the same.

2. Description of the Related Art

Recently, various mobile electronic apparatuses, such as portable phones, navigation devices, digital cameras, electronic books, and portable game consoles, and various other kinds of terminals to which a liquid crystal display device or an organic light emitting diode display device is applied as a display device have been developed.

In a typical display device used in, for example, a mobile electronic apparatus, a transparent cover window is provided at a front side of a display panel and a user views the display panel through the cover window. Because the cover window is positioned at an outermost side of the display device, the cover window should be strong against external impacts so as to protect the display panel and the like in the mobile electronic apparatus.

Recently, a structure in which a touch panel is integrated with a display screen (or display panel) and is used as an input device instead of, for example, a switch or a keyboard, has come into widespread use. Compared to an existing mobile apparatus, in many cases, because a surface of the cover window comes into contact with a finger and the like during use of the touch panel, the cover window should have high strength.

Further, recently, research on a flexible display device has been actively conducted, and a cover window applied to such a flexible display device should also be flexible.

However, because strength and flexibility of the cover window are in a trade-off relationship with each other, it is not easy to implement a strong and flexible cover window.

The above information disclosed in this Background section is for enhancement of understanding of the background of the described technology, and therefore, it may contain information that does not form the prior art.

SUMMARY

Aspects and features of the present invention provide a cover window for a display device and a display device including the same that is configured to be folded or bent and has a relatively high surface hardness.

An exemplary embodiment provides a cover window for a display device including: a first film; a second film on the first film; and an adhesive layer between the first film and the second film. The adhesive layer has a lap shear modulus in a range of 20 kPa to 50 kPa.

The adhesive layer may have a storage modulus in a range of 100 kPa to 10 MPa.

The adhesive layer may have a loss modulus in a range of 100 kPa to 10 MPa.

A ratio of the loss modulus to the storage modulus of the adhesive layer may be in a range of 0.01 to 100.

The adhesive layer may have adherence in a range of 500 gf to 3000 gf.

The adhesive layer may have a thickness in a range of 1 μm to 50 μm.

The thickness of the adhesive layer may be in a range of 20 μm to 30 μm.

The cover window may have a thickness in a range of 1 μm to 500 μm.

The cover window for the display device may further include a third film on the second film and a second adhesive layer between the second film and the third film.

The adhesive layer may have a modulus of elasticity that gradually varies along a thickness direction thereof.

Another embodiment provides a display device including: a display panel; a cover window on the display panel; and a coating layer on the cover window. The cover window includes a first film, a second film on the first film, and an adhesive layer between the first film and the second film and including an elastic polymer. The adhesive layer has a lap shear modulus in a range of 20 kPa to 50 kPa.

The adhesive layer may have a storage modulus in a range of 100 kPa to 10 MPa.

The adhesive layer may have a loss modulus in a range of 100 kPa to 10 MPa.

A ratio of the loss modulus to the storage modulus of the adhesive layer may be in a range of 0.01 to 100.

The adhesive layer may have adherence in a range of 500 gf to 3000 gf.

The adhesive layer may have a thickness in a range of 1 μm to 50 μm.

The thickness of the adhesive layer may be in a range of 20 μm to 30 μm.

The cover window may have a thickness in a range of 1 μm to 500 μm.

The display device may further include a third film on the second film and a second adhesive layer between the second film and the third film.

The adhesive layer may have a modulus of elasticity that gradually varies along a thickness direction thereof.

According to exemplary embodiments of the present invention, a cover window for a display device and a display device including the same are provided that can be folded or bent and has a relatively high surface hardness.

DETAILED DESCRIPTION

Figure 1:
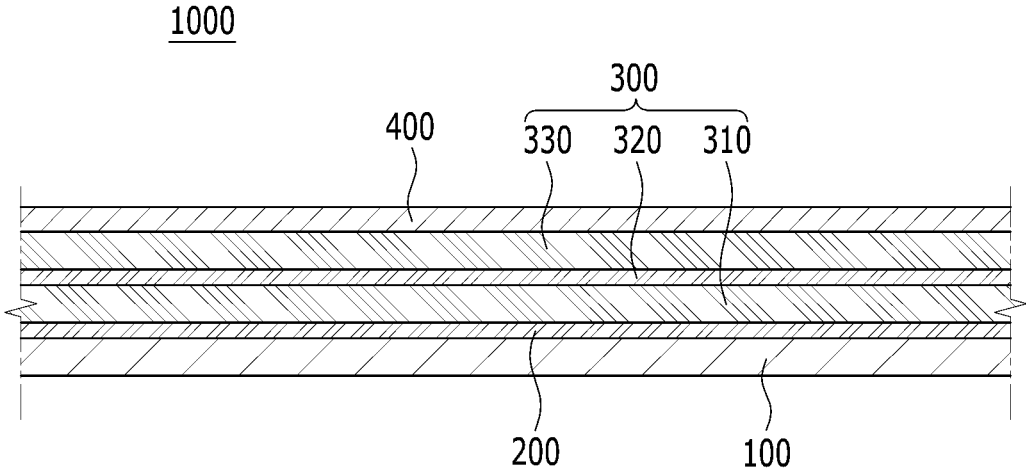
FIG. 1 illustrates a cross-sectional view of a display device according to an exemplary embodiment.

The present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

To clearly describe the present invention, portions which do not specifically relate to the aspects and features of the present invention may be omitted. Like reference numerals designate like elements throughout the specification.

Further, sizes and thicknesses of components and/or layers shown in the drawings may be arbitrarily shown for better understanding and ease of description, and the present invention is not limited thereto. For example, in the drawings, the thicknesses of layers, films, panels, regions, etc. may be exaggerated for clarity.

It will be understood that when an element, such as a layer, film, region, or substrate, is referred to as being "on" another element, it can be directly on the other element or intervening elements may also be present. When an element is referred to as being "directly on" another element, there are no intervening elements present.

Further, in the specification, the word "on" or "above" means positioned on, above, or below the object portion and does not necessarily mean positioned on the upper side of the object portion based on a gravitational direction. It will be understood that, although the terms first, second, third, etc. may be used herein to describe various elements, components, regions, layers, and/or sections, these elements, components, regions, layers, and/or sections should not be limited by these terms.

In addition, unless explicitly described to the contrary, the word "comprise" and "include" and variations, such as "comprises," "comprising," "includes," or "including," will be understood to imply the inclusion of stated elements but not the exclusion of any other elements. As used herein, the singular forms "a" and "an" are intended to include the plural forms as well, unless the context clearly indicates otherwise. Further, the use of "may" when describing embodiments of the present invention relates to "one or more embodiments of the present invention."

Throughout the specification, the phrase "on a plane" means viewing the object portion from the top and the phrase "on a cross-section" means viewing a cross-section of which the object portion that vertically cut from the side.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein.

Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

A display device according to an exemplary embodiment will now be described with reference to FIG. 1.

FIG. 1 illustrates a cross-sectional view of a display device according to an exemplary embodiment.

As shown in FIG. 1, the display device 1000 according to an exemplary embodiment includes: a display panel 100; a cover window 300 disposed on the display panel 100; an adhesive layer 200 disposed between the display panel 100 and the cover window 300; and a coating layer 400 disposed on the cover window 300.

The display panel 100 may be flexible, stretchable, foldable, bendable, or rollable. The display panel 100 may be bent.

The display panel 100 may be formed as an organic light emitting diode display panel. The display panel 100 may include a substrate, a plurality of thin film transistors, a plurality of electrodes disposed on the substrate, and the like. Because the substrate is flexible, stretchable, foldable, bendable, or rollable, the display panel 100 may also be flexible, stretchable, foldable, bendable, or rollable.

Although the display panel 100 has been described above as being the organic light emitting diode display panel, the present invention is not limited thereto. According to another exemplary embodiment, the display panel 100 may be formed as a liquid crystal panel, an electrophoretic display panel, an electrowetting display panel, or the like.

An optical layer may be disposed on the display panel 100. In some embodiments, the optical layer may be mounted within (e.g., may be integral with) the display panel 100. The optical layer may include a phase delay layer, a polarization layer, and the like.

The adhesive layer 200 may include an optically clear adhesive (OCA), an optically clear resin (OCR), a pressure sensitive adhesive (PSA), or the like. The adhesive layer 200 disposed between the display panel 100 and the cover window 300 adheres the display panel 100 and the cover window 300 to each other.

The cover window 300, disposed on the display panel 100 to be adhered to the display panel 100 by the adhesive layer 200, may protect the display panel 100 against external interference, such as external impacts. A thickness of the cover window 300 may be in a range of 1 μm to 500 μm. The cover window 300 includes a first film 310, a second film 330, and an adhesive layer 320 disposed between the first film 310 and the second film 330.

The first film 310 is disposed on the display panel 100. For example, a distance between the second film 330 and the display panel 100 is greater than a distance between the first film 310 and the display panel 100.

The second film 330 is disposed on the first film 310 close to the coating layer 400. For example, a distance between the first film 310 and the coating layer 400 is greater than a distance between the second film 330 and the coating layer 400.

The first film 310 and the second film 330 may be made of the same material or may be made of different materials. The first film 310 and the second film 330 may include polyimide (PI), polyamide-imide (PAI), polyether ether ketone (PEEK), and/or polyetherimide (PEI).

The adhesive layer 320 is disposed on (e.g., is between) the first film 310 and the second film 330. The adhesive layer 320 may be made of an elastic polymer having a modulus that is lower than those of the first film 310 and the second film 330.

By reducing stress generated in the adhesive layer 320 when the display device 1000 is bent or folded, it is possible to improve a folding characteristic of the display device 1000. Further, because the adhesive layer 320 is resilient, a hardness of the display device 1000 can be improved through a repulsion and restoration characteristic thereof.

The adhesive layer 320 may be formed to have a film-like shape by a thermal or compression process and may be formed of ethylene vinyl acetate (EVA), polydimethylsiloxane (PDMS), polyurethane (PU), or the like. However, the adhesive layer 320 is not limited thereto, and it may be made of an optically clear resin or an optically clear adhesive, such as urethane, acryl, and a silicon-based material. The adhesive layer 320 may be made of a single material or of two or more kinds of materials.

The coating layer 400 is coated on a surface of the second film 330 and is formed as a functional coating layer. The coating layer 400 may serve as a hard coating layer, an anti-fingerprint (AF) coating layer, an anti-reflection (AR) coating layer, and/or an anti-glare (AG) coating layer.

Hereinafter, a lap shear modulus of an adhesive layer of a cover window of a display device according to an exemplary embodiment will be described with reference to FIG. 2.

Figure 2:
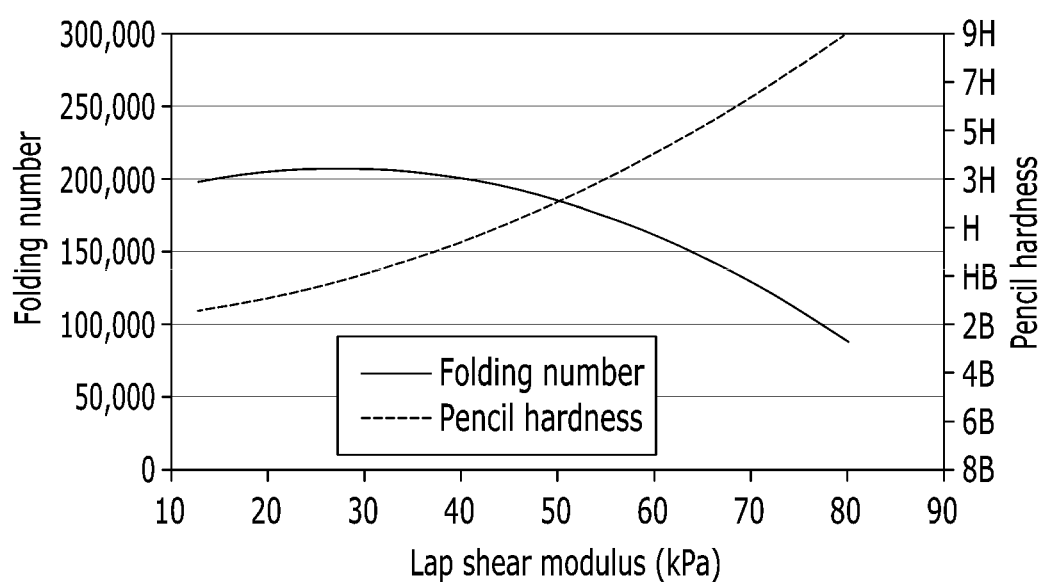
FIG. 2 illustrates a graph of a folding number and a pencil hardness with respect to a lap shear modulus (e.g., shear modulus) of an adhesive layer of a cover window of a display device according to an exemplary embodiment.

FIG. 2 illustrates a graph of a number of folds and a pencil hardness with respect to lap shear modulus of an adhesive layer of a cover window of a display device according to an exemplary embodiment.

The lap shear modulus (or shear modulus) is a ratio of a shear stress of a given material within an elastic limit to a shear strain thereof.

A test of bending the display device a number of times was performed to check (or determine) a folding characteristic, and the number of folds when the cover window is first damaged is shown.

In addition, in order to check a hardness characteristic, a pencil hardness test was performed on the display device.

As shown in FIG. 2, as the lap shear modulus of the adhesive layer of the cover window increases, there is a tendency for the folding number thereof (e.g., the number of folds when the window is damaged) to decrease. In addition, as the lap shear modulus of the adhesive layer of the cover window increases, there is a tendency for the pencil hardness thereof to increase.

When the lap shear modulus of the adhesive layer of the cover window of the display device is about 20 kPa, the cover window may withstand damage until the display device is folded about 200,000 times (e.g., until the folding number of the display device is about 200,000). When the lap shear modulus of the cover window of the display device is about 20 kPa, the display device may have a hardness of about (e.g., close to) pencil hardness B.

When the lap shear modulus of the adhesive layer of the cover window of the display device is about 30 kPa, the cover window may withstand damage until the folding number of the display device is about 210,000 and the display device may have a hardness of about pencil hardness HB.

When the lap shear modulus of the adhesive layer of the cover window of the display device is about 40 kPa, the cover window may withstand damage until the folding number of the display device is about 200,000 and the display device may have a hardness of about pencil hardness F.

When the lap shear modulus of the adhesive layer of the cover window of the display device is about 50 kPa, the cover window may withstand damage until the folding number of the display device is about 180,000 and the display device may have a hardness of about pencil hardness H.

When the lap shear modulus of the adhesive layer of the cover window of the display device is about 60 kPa, the cover window may withstand damage until the folding number of the display device is about 160,000 and the display device may have a hardness of about pencil hardness 4H.

When the lap shear modulus of the adhesive layer of the cover window of the display device is about 70 kPa, the cover window may withstand damage until the folding number of the display device is about 130,000 and the display device may have a hardness of about pencil hardness 5H.

When the lap shear modulus of the adhesive layer of the cover window of the display device is about 80 kPa, the cover window may withstand damage until the folding number of the display device is about 90,000 and the display device may have a hardness of about pencil hardness 9H.

Through this test, it can be seen that the lap shear modulus of the adhesive layer of the cover window affects the folding number (or folding characteristic) and the hardness of the display device. When the lap shear modulus of the adhesive layer of the cover window is in a range of about 20 kPa to about 50 kPa, the folding number is about 200,000, corresponding to an excellent folding number, and the pencil hardness is B or greater. When the lap shear modulus of the adhesive layer of the cover window is less than about 20 kPa, the hardness of the display device may be undesirably low, and when the lap shear modulus of the adhesive layer of the cover window is greater than about 50 kPa, the folding number may be undesirably low. Therefore, considering both the folding number and the hardness, the lap shear modulus of the adhesive layer of the cover window may desirably be in a range of about 20 kPa to about 50 kPa.

In addition, a steel wool test was performed to check a scratch characteristic according to the lap shear modulus of the adhesive layer of the cover window. According to a test result, a scratch failure occurred when the lap shear modulus of the adhesive layer of the cover window was less than about 20 kPa. Further, a scratch failure did not occur when the lap shear modulus of the adhesive layer of the cover window was in a range of about 20 kPa to about 80 kPa. Therefore, considering the hardness, the folding number, and the scratch characteristic, the lap shear modulus of the adhesive layer of the cover window may desirably be in a range of about 20 kPa to about 50 kPa.

Now, a storage modulus of an adhesive layer of a cover window of a display device according to an exemplary embodiment will be described with reference to FIG. 3.

Figure 3:
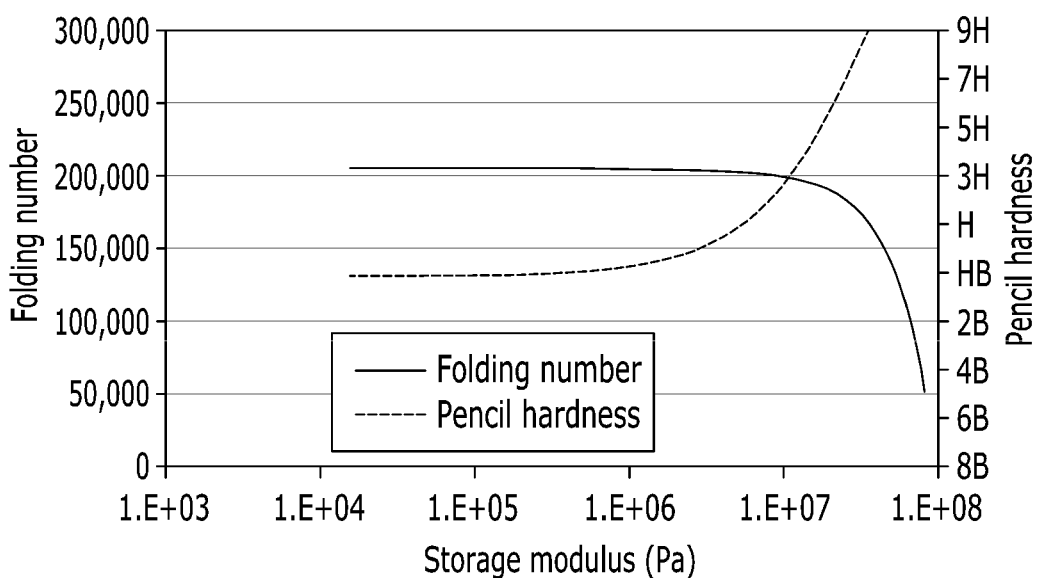
FIG. 3 illustrates a graph of a folding number and a pencil hardness with respect to a storage modulus of an adhesive layer of a cover window of a display device according to an exemplary embodiment.

FIG. 3 illustrates a graph of the folding number and the pencil hardness with respect to the storage modulus of an adhesive layer of a cover window of a display device according to an exemplary embodiment.

As shown in FIG. 3, as the storage modulus of the adhesive layer of the cover window increases, there is a tendency for the folding number thereof to decrease. As the storage modulus of the adhesive layer of the cover window increases, there is a tendency for the pencil hardness thereof to increases.

When the storage modulus of the adhesive layer of the cover window of the display device is about 100 kPa, the cover window may withstand damage until the folding number of the display device is about 200,000. When the storage modulus of the cover window of the display device is about 100 kPa, the display device may have a hardness of about pencil hardness HB.

When the storage modulus of the adhesive layer of the cover window of the display device is about 1 MPa, the cover window may withstand damage until the folding number of the display device is about 200,000 and the display device may have a hardness of about pencil hardness HB.

When the storage modulus of the adhesive layer of the cover window of the display device is about 10 MPa, the cover window may withstand damage until the folding number of the display device is about 200,000 and the display device may have a hardness of about pencil hardness 3H.

When the storage modulus of the adhesive layer of the cover window of the display device is about 100 MPa, the cover window may withstand damage until the folding number of the display device is about 50,000 and the display device may have a hardness of about pencil hardness 7H.

Through this test, it can be seen that the storage modulus of the adhesive layer of the cover window affects the folding number (or folding characteristic) and the hardness of the display device. Therefore, considering both the folding number and the hardness, the storage modulus of the adhesive layer of the cover window may desirably be in a range of about 100 kPa to about 10 MPa.

A loss modulus of an adhesive layer of a cover window of a display device according to an exemplary embodiment will now be described with reference to FIG. 4.

Figure 4:
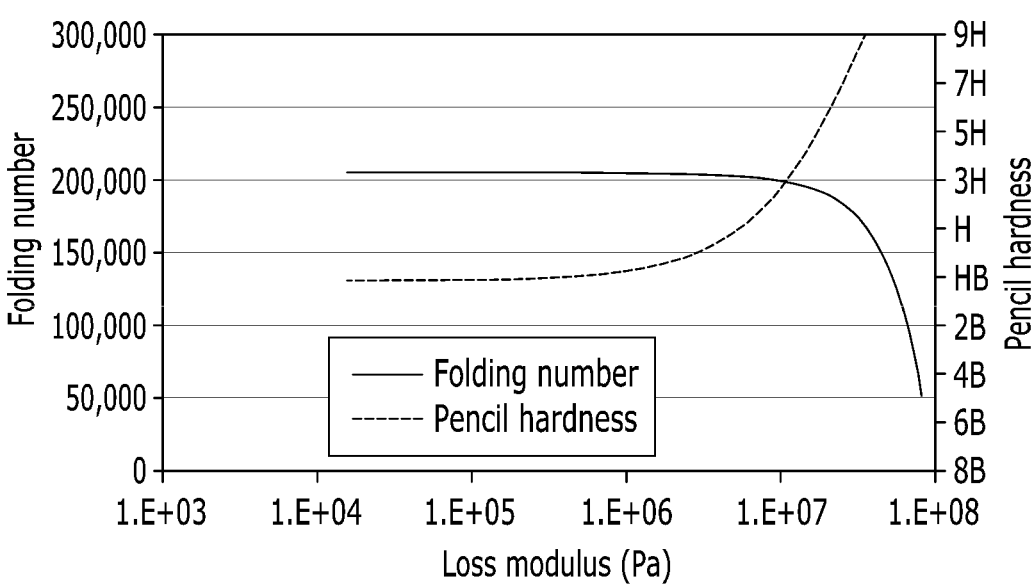
FIG. 4 illustrates a graph of a folding number and pencil hardness with respect to a loss modulus of an adhesive layer of a cover window of a display device according to an exemplary embodiment.

FIG. 4 illustrates a graph of the folding number and the pencil hardness with respect to the loss modulus of an adhesive layer of a cover window of a display device according to an exemplary embodiment.

As shown in FIG. 4, as the loss modulus of the adhesive layer of the cover window increases, there is a tendency for the folding number thereof to decrease. As the loss modulus of the adhesive layer of the cover window increases, there is a tendency for the pencil hardness thereof to increase.

When the loss modulus of the adhesive layer of the cover window of the display device is about 100 kPa, the cover window may withstand damage until the folding number of the display device is about 200,000. When the loss modulus of the cover window of the display device is about 100 kPa, the display device may have a hardness of about pencil hardness HB.

When the loss modulus of the adhesive layer of the cover window of the display device is about 1 MPa, the cover window may withstand damage until the folding number of the display device is about 200,000 and the display device may have a hardness of about pencil hardness HB.

When the loss modulus of the adhesive layer of the cover window of the display device is about 10 MPa, the cover window may withstand damage until the folding number of the display device is about 200,000 and the display device may have a hardness of about pencil hardness 3H.

When the loss modulus of the adhesive layer of the cover window of the display device is about 100 MPa, the cover window may withstand damage until the folding number of the display device is about 50,000 and the display device may have a hardness of about pencil hardness 7H.

Through this test, it can be seen that the loss modulus of the adhesive layer of the cover window affects the folding number (or folding characteristic) and the hardness of the display device. Therefore, considering both the folding number and the hardness, the loss modulus of the adhesive layer of the cover window may desirably be in a range of about 100 kPa to about 10 MPa.

Considering the test results of FIGS. 3 and 4, a ratio of the loss modulus to the storage modulus of the adhesive layer of the cover window may desirably be in a range of 0.01 to 100.

Adherence of an adhesive layer of a cover window of a display device according to an exemplary embodiment will now be described with reference to FIG. 5.

Figure 5:
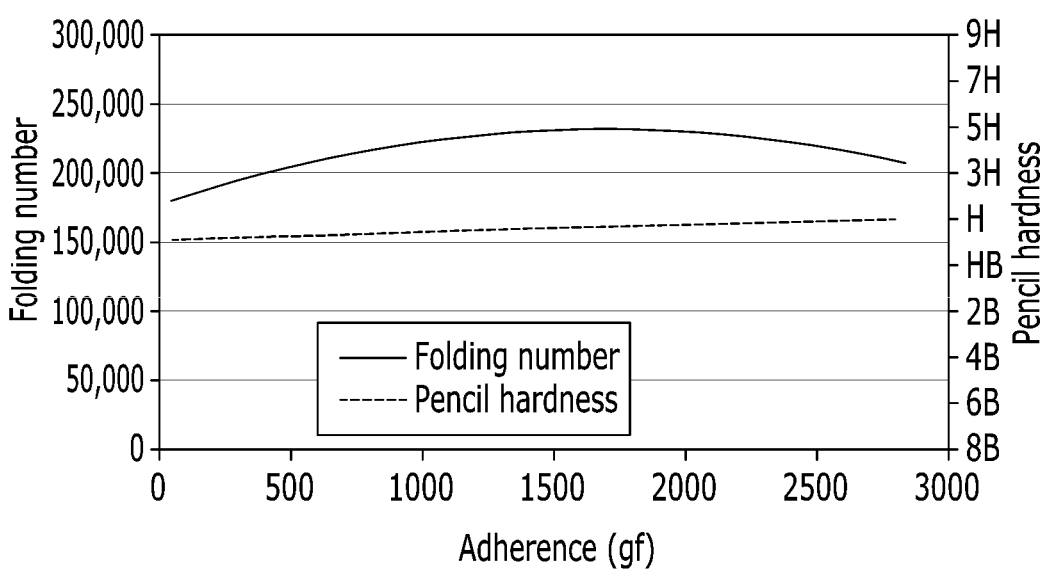
FIG. 5 illustrates a graph of a folding number and a pencil hardness with respect to adherence of an adhesive layer of a cover window of a display device according to an exemplary embodiment.

FIG. 5 illustrates a graph of the folding number and the pencil hardness with respect to adherence of an adhesive layer of a cover window of a display device according to an exemplary embodiment.

As shown in FIG. 5, as the adherence of the adhesive layer of the cover window increases, there is a tendency for the folding number thereof to first increase and then decrease. In addition, as the adherence of the adhesive layer of the cover window increases, there is a tendency for the pencil hardness thereof to increase.

When the adherence of the adhesive layer of the cover window of the display device is about 500 gram-force (gf), the cover window may withstand damage until the folding number of the display device is about 200,000. When the adherence of the cover window of the display device is about 500 gf, the display device may have a hardness of about pencil hardness F.

When the adherence of the adhesive layer of the cover window of the display device is about 1000 gf, the cover window may withstand damage until the folding number of the display device is about 230,000 and the display device may have a hardness of about pencil hardness F.

When the adherence of the adhesive layer of the cover window of the display device is about 1500 gf, the cover window may withstand damage until the folding number of the display device is about 240,000 and the display device may have a hardness of about pencil hardness F.

When the adherence of the adhesive layer of the cover window of the display device is about 2000 gf, the cover window may withstand damage until the folding number of the display device is about 240,000 and the display device may have a hardness of about pencil hardness F.

When the adherence of the adhesive layer of the cover window of the display device is about 2500 gf, the cover window may withstand damage until the folding number of the display device is about 230,000 and the display device may have a hardness of about pencil hardness F.

When the adherence of the adhesive layer of the cover window of the display device is about 3000 gf, the cover window may withstand damage until the folding number of the display device is about 200,000 and the display device may have a hardness of about pencil hardness H.

Through this test, it can be seen that the adherence of the adhesive layer of the cover window affects the folding number (or folding characteristic) of the display device. Therefore, considering the folding number, the adherence of the adhesive layer of the cover window may desirably be in a range of about 500 gf to about 3000 gf.

A thickness of an adhesive layer of a cover window of a display device according to an exemplary embodiment will now be described with reference to FIG. 6.

Figure 6:
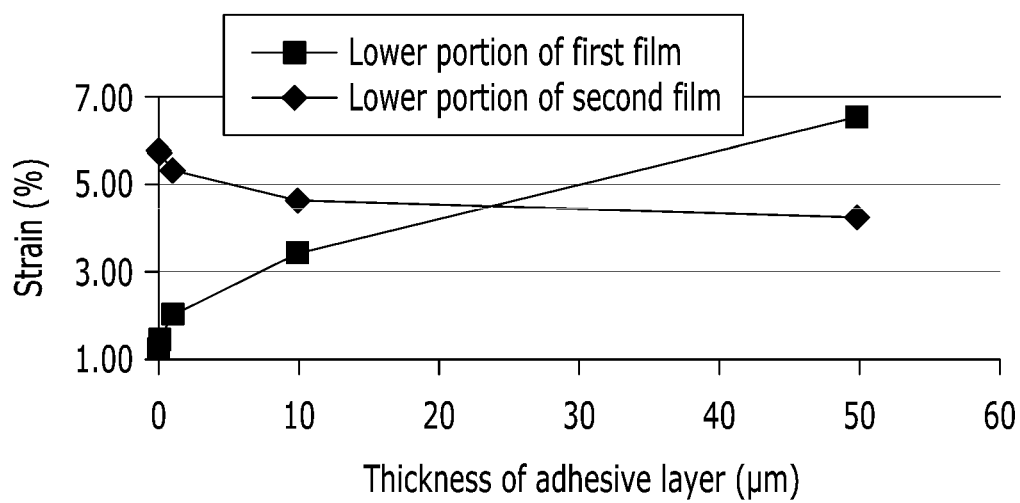
FIG. 6 illustrates a graph of strain with respect to a thickness of an adhesive layer of a cover window of a display device according to an exemplary embodiment.

FIG. 6 illustrates a graph of strain with respect to a thickness of an adhesive layer of a cover window of a display device according to an exemplary embodiment.

As shown in FIG. 6, as the thickness of the adhesive layer of the cover window increases, there is a tendency for the strain at a lower portion of the first film to increase. The lower portion of the first film is a border between the first film 310 and the adhesive layer 200 (see, e.g., FIG. 1). As the thickness of the adhesive layer of the cover window increases, there is a tendency for the strain at a lower portion of the second film to decrease. The lower portion of the second film is a border between the second film 330 and the adhesive layer 320 of the cover window 300 (see, e.g., FIG. 1).

When there is no adhesive layer in the cover window (e.g., when the adhesive layer 320 is omitted from the cover window 300), the strain at the lower portion of the first film is about 1% and the strain at the lower portion of the second film is about 6%.

When the thickness of the adhesive layer of the cover window is about 10 μm, the strain at the lower portion of the first film is equal to or greater than about 3% and the strain at the lower portion of the second film is equal to or less than about 6%.

When the thickness of the adhesive layer of the cover window is about 20 μm, the strain at the lower portion of the first film is about 4% and the strain at the lower portion of the second film is equal to or greater than about 4%.

When the thickness of the adhesive layer of the cover window is about 30 μm, the strain at the lower portion of the first film is about 5% and the strain at the lower portion of the second film is about 4%.

When the thickness of the adhesive layer of the cover window is about 40 μm, the strain at the lower portion of the first film is about 6% and the strain at the lower portion of the second film is about 4%.

When the thickness of the adhesive layer of the cover window is about 50 μm, the strain at the lower portion of the first film is about 7% and the strain at the lower portion of the second film is about 4%.

Through this test, it can be seen that the thickness of the adhesive layer of the cover window affects the strains at the lower portions of the first and second films. The thickness of the adhesive layer of the cover window may be in a range of 1 μm to 50 μm. When the thickness of the adhesive layer of the cover window is 1 μm, the strain at the lower portion of the first film may be substantially reduced or minimized but the strain at the lower portion of the second film relatively increases. When the thickness of the adhesive layer of the cover window is 50 μm, the strain at the lower portion of the second film is substantially reduced or minimized but the strain at the lower portion of the first film relatively increases. Therefore, considering both the strain at the lower portion of the first film and the strain at the lower portion of the second film, the thickness of the adhesive layer of the cover window may desirably be in a range of 20 μm to 30 μm.

According to the test results, the lap shear modulus of the adhesive layer of the cover window may desirably be in a range of 20 kPa to 50 kPa, the storage modulus thereof may desirably be in a range of 100 kPa to 10 MPa, the loss modulus thereof may desirably be in a range of 100 kPa to 10 MPa, the ratio of the loss modulus to the storage modulus thereof may desirably be in a range of 0.01 to 100, the adherence thereof may desirably be in a range of 500 gf to 3000 gf, and the thickness thereof may desirably be in a range of 20 μm to 30 μm.

The lap shear modulus of a typical pressure sensitive adhesive (PSA) is in a range of 10 kPa to 20 kPa and the storage modulus thereof is in a range of 1 kPa to 10 kPa. It is possible to provide a pressure sensitive adhesive (PSA) having certain characteristics by forming cross-linking therein through a cross-linker. For example, according to an exemplary embodiment, the lap shear modulus of a cross-linked pressure sensitive adhesive (PSA) may be in a range of 20 kPa to 50 kPa and the storage modulus thereof may be in a range of 100 kPa to 10 MPa. The cross-linked pressure sensitive adhesive (PSA) may be used as the adhesive layer of the cover window.

A cover window of a display device according to an exemplary embodiment will now be described with reference to FIG. 7.

Figure 7:
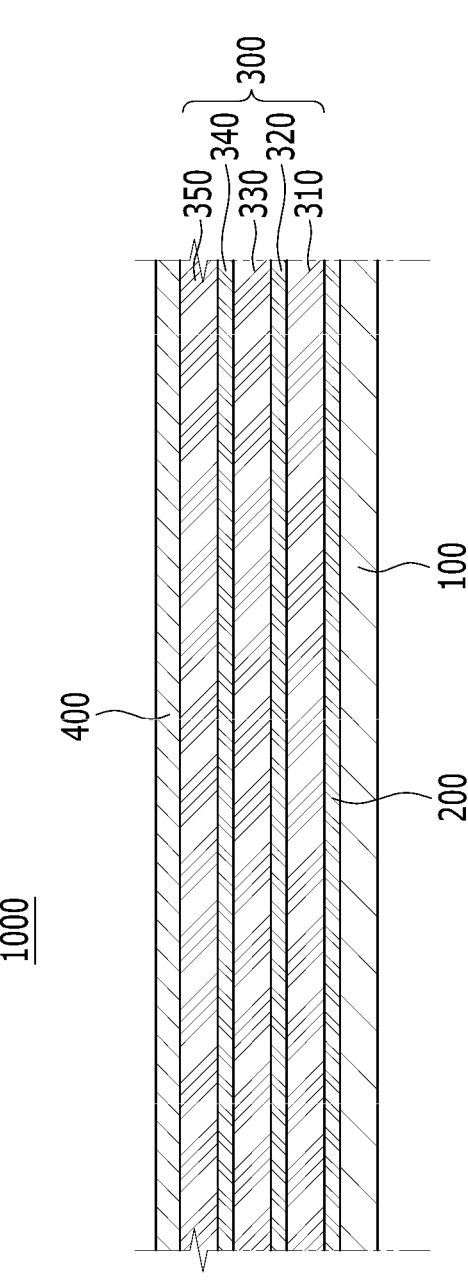
FIG. 7 illustrates a cross-sectional view of a display device according to an exemplary embodiment.

Because many portions of the display device according to the exemplary embodiment shown in FIG. 7 are the same or are substantially the same as those of the display device according to the exemplary embodiment shown in FIG. 1, a repeated description of such portions may be omitted. The present exemplary embodiment is primarily different from the aforementioned exemplary embodiment in that the cover window includes a third film, and this aspect will be described in more detail below.

FIG. 7 illustrates a cross-sectional view of a display device according to an exemplary embodiment.

As in the aforementioned exemplary embodiment, the display device 1000 according to the present exemplary embodiment includes the display panel 100, the cover window 300, and the coating layer 400.

The cover window 300 includes the first film 310, the second film 330, and a third film 350. For example, the cover window 300 of the aforementioned exemplary embodiment includes two films, and the cover window 300 of the present exemplary embodiment includes three films. However, the present exemplary embodiment is not limited thereto, and the cover window 300 thereof may include four or more films.

The adhesive layer 320 is disposed between the first film 310 and the second film 330, and an adhesive layer 340 is disposed between the second film 330 and the third film 350. The adhesive layers 320 and 340 of the cover window 300 may be made of an elastic polymer having a modulus (or a modulus of elasticity) that is lower than those of the first film 310, the second film 330, and the third film 350.

A cover window of a display device according to another exemplary embodiment will now be described with reference to FIG. 8.

Figure 8:
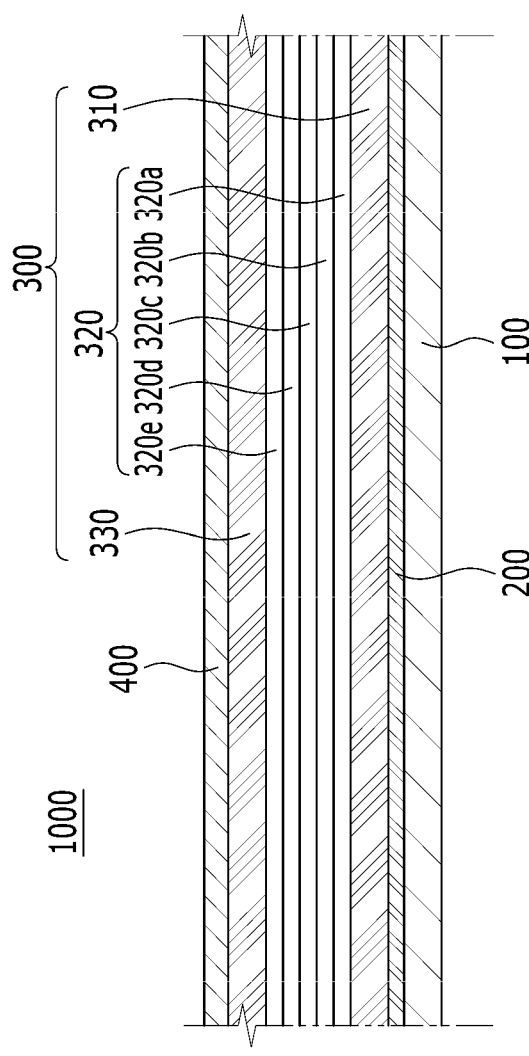
FIG. 8 illustrates a cross-sectional view of a display device according to another exemplary embodiment.

Because many portions of the display device according to the exemplary embodiment shown in FIG. 8 are the same or are substantially the same as those of the display device according to the exemplary embodiment shown in FIG. 1, a repeated description of such portions may be omitted. The present exemplary embodiment is primarily different from the aforementioned exemplary embodiment in that adhesive layers of the cover window have different physical properties according to a thickness direction thereof, and this will be described in more detail below.

FIG. 8 illustrates a cross-sectional view of a display device according to the present exemplary embodiment.

As in the aforementioned exemplary embodiment, the display device 1000 according to the present exemplary embodiment includes the display panel 100, the cover window 300, and the coating layer 400. The cover window 300 includes the first film 310, the second film 330, and the adhesive layer 320 disposed between the first film 310 and the second film 330.

The adhesive layer 320 may include a first adhesive layer 320a, a second adhesive layer 320b, a third adhesive layer 320c, a fourth adhesive layer 320d, and a fifth adhesive layer 320e. The first adhesive layer 320a, the second adhesive layer 320b, the third adhesive layer 320c, the fourth adhesive layer 320d, and the fifth adhesive layer 320e may have different physical properties.

For example, the modulus of the first adhesive layer 320a may be greater than that of the second adhesive layer 320b, and the modulus of the second adhesive layer 320b may be greater than that of the third adhesive layer 320c. The modulus of the third adhesive layer 320c may be greater than that of the fourth adhesive layer 320d, and the modulus of the fourth adhesive layer 320d may be greater than that of the fifth adhesive layer 320e. For example, the modulus may decrease from the first adhesive layer 320a to the fifth adhesive layer 320e. It has been described that the modulus of the adhesive layer 320 gradually decreases in five steps, but the present invention is not limited thereto. The modulus of the adhesive layer 320 may continuously decrease from the lower portion thereof to the upper portion thereof.

As another example, the modulus of the first adhesive layer 320a may be lower than that of the second adhesive layer 320b, and the modulus of the second adhesive layer 320b may be lower than that of the third adhesive layer 320c. The modulus of the third adhesive layer 320c may be lower than that of the fourth adhesive layer 320d, and the modulus of the fourth adhesive layer 320d may be lower than that of the fifth adhesive layer 320e. For example, the modulus may increase from the first adhesive layer 320a to the fifth adhesive layer 320e. It has been described that the modulus of the adhesive layer 320 gradually increases in five steps, but the present invention is not limited thereto. The modulus of the adhesive layer 320 may continuously increase from the lower portion thereof to the upper portion thereof.

As yet another example, the modulus of the first adhesive layer 320a may be lower than that of the second adhesive layer 320b, and the modulus of the second adhesive layer 320b may be lower than that of the third adhesive layer 320c. The modulus of the third adhesive layer 320c may be greater than that of the fourth adhesive layer 320d, and the modulus of the fourth adhesive layer 320d may be greater than that of the fifth adhesive layer 320e. For example, the modulus may first increase and then decrease from the first adhesive layer 320a toward the fifth adhesive layer 320e. It has been described that the modulus of the adhesive layer 320 increases from the first adhesive layer 320a toward the fifth adhesive layer 320e and then again decreases in five steps, but the present invention is not limited thereto. The modulus of the adhesive layer 320 may continuously decrease from the center thereof to the lower and upper portions.

As described above, the modulus of the adhesive layer 320 may gradually change or vary along a thickness direction thereof. In addition, other physical properties of the adhesive layer 320 may gradually change or vary along the thickness direction thereof. In addition, the range of number of mentioned previously may be subject to ±10% in error due to process error or measurement distribution range.

While this disclosure has been described in connection with what is presently considered to be practical exemplary embodiments, it is to be understood that the present invention is not limited to the disclosed embodiments. Rather, the present invention is intended to cover various modifications and equivalent arrangements included within the spirit and scope of the appended claims and their equivalents.

DESCRIPTION OF SOME REFERENCE SYMBOLS

100: display panel
300: cover window
310: first film
320: adhesive layer
330: second film
400: coating layer

What is claimed is:

1. A bendable display device comprising:
a bendable display panel; and
a bendable cover window on the display panel, the cover window comprising:
  a first film;
  a second film on the first film; and
  a first adhesive layer between the first film and the second film;
a coating layer on the cover window;
a second adhesive layer between the display panel and the cover window; and
an optical layer on the display panel,
wherein the cover window has a thickness in a range of 1 μm to 500 μm,
wherein the optical layer contacts the second adhesive layer,
wherein the first adhesive layer has a lap shear modulus in a range of 20 kPa to 50 kPa,
wherein the first adhesive layer has a modulus of elasticity that gradually varies along a thickness direction thereof,
wherein the first adhesive layer includes a first sub-layer, a second sub-layer, a third sub-layer, a fourth sub-layer, and a fifth sub-layer, and
wherein the modulus of elasticity of the first adhesive layer decreases, increases, or increases and then decreases from the first sub-layer to the fifth sub-layer.

2. The bendable display device of claim 1, wherein the optical layer comprises at least one of a phase delay layer or a polarization layer.

3. The bendable display device of claim 1, wherein the coating layer comprises a hard coating layer.

4. The bendable display device of claim 1, wherein the first film and the second film comprise a polyimide-based material.

5. The bendable display device of claim 1, further comprising:
a third film on the second film; and
a third adhesive layer between the second film and the third film.

6. The bendable display device of claim 1, wherein the first adhesive layer has a storage modulus in a range of 100 kPa to 10 MPa.

7. The bendable display device of claim 6, wherein the first adhesive layer has a loss modulus in a range of 100 kPa to 10 MPa.

8. The bendable display device of claim 7, wherein a ratio of the loss modulus to the storage modulus of the first adhesive layer is in a range of 0.01 to 100.

9. The bendable display device of claim 1, wherein the first adhesive layer has an adherence in a range of 500 gf/25 mm to 3000 gf/25 mm.

10. The bendable display device of claim 1, wherein the first adhesive layer has a thickness in a range of 1 μm to 50 μm.

11. The bendable display device of claim 1, wherein the first adhesive layer has a thickness in a range of 20 μm to 30 μm.

\* \* \* \* \*